(12) United States Patent
Yoo et al.

(10) Patent No.: US 9,513,542 B2
(45) Date of Patent: Dec. 6, 2016

(54) LITHOGRAPHY MASK AND METHOD OF FORMING A LITHOGRAPHY MASK

(71) Applicant: Taiwan Semiconductor Manufacturing Company, Ltd., Hsin-Chu (TW)

(72) Inventors: Chue San Yoo, Hsin-Chu (TW); Chun-Lang Chen, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 70 days.

(21) Appl. No.: 14/558,097

(22) Filed: Dec. 2, 2014

(65) Prior Publication Data

US 2015/0132685 A1    May 14, 2015

Related U.S. Application Data

(62) Division of application No. 13/324,755, filed on Dec. 13, 2011, now Pat. No. 8,921,014.

(60) Provisional application No. 61/547,468, filed on Oct. 14, 2011.

(51) Int. Cl.
*G03F 1/54*    (2012.01)
*G03F 1/58*    (2012.01)
*G03F 1/80*    (2012.01)
*H01L 21/033*    (2006.01)

(52) U.S. Cl.
CPC . *G03F 1/58* (2013.01); *G03F 1/54* (2013.01); *G03F 1/80* (2013.01); *H01L 21/0332* (2013.01)

(58) Field of Classification Search
CPC ............... G03F 1/58; G03F 1/54; G03F 1/80; H01L 21/0332
USPC .......................................................... 430/5
See application file for complete search history.

(56) References Cited

U.S. PATENT DOCUMENTS

| 6,569,580 B2 | 5/2003 | Campi et al. |
| 2010/0092874 A1 | 4/2010 | Nozawa et al. |
| 2011/0287346 A1 | 11/2011 | Sakai et al. |

*Primary Examiner* — Christopher Young
(74) *Attorney, Agent, or Firm* — Slater Matsil, LLP

(57) ABSTRACT

A first embodiment is a lithography mask comprising a transparent substrate and a first molybdenum silicon nitride ($Mo_xSi_yN_z$) layer. The first $Mo_xSi_yN_z$ layer is over the transparent substrate. A percentage of molybdenum (x) of the first $Mo_xSi_yN_z$ layer is between 1 and 2. A percentage of silicon (y) of the first $Mo_xSi_yN_z$ layer is between 50 and 55. A percentage of nitride (z) of the first $Mo_xSi_yN_z$ layer is between 40 and 50. The first $Mo_xSi_yN_z$ layer has an opening therethrough.

20 Claims, 2 Drawing Sheets

LITHOGRAPHY MASK AND METHOD OF FORMING A LITHOGRAPHY MASK

This application is a divisional of U.S. patent application Ser. No. 13/324,755, filed Dec. 13, 2011, now U.S. Pat. No. 8,921,014, entitled "Lithography Mask and Method of Forming a Lithography Mask," which claims the benefit of U.S. Provisional Application No. 61/547,468, filed on Oct. 14, 2011, entitled "Lithography Mask and Method of Forming a Lithography Mask," which applications are hereby incorporated herein by reference in their entireties.

BACKGROUND

In semiconductor processing, multiple lithography steps are generally used to form a semiconductor chip. These steps typically include forming a photoresist over a substrate that is to be formed into the semiconductor chip, exposing the photoresist to a pattern of light generally controlled by a mask, developing the pattern in the photoresist to expose the underlying substrate, and etching the pattern in the underlying substrate. The pattern etched in the underlying substrate may be a basis for some feature formation, such as an ion impurity implantation such as for doping source and drain regions, a formation of a structure like a gate patterning, or a pattern for a conductive material such as in a metallization layer.

Advances in semiconductor processing have generally allowed for continued reduction of minimum feature sizes for semiconductor chips; however, each reduction in size typically is accompanied with its own challenges. As minimum feature size decreases, overlay concerns are typically intensified. Minimum feature size reduction allows for a greater density of features in a given area, which in turn increases the likelihood that an improperly overlaid feature can render the chip useless.

To help avoid improper overlaying of features, critical dimensions of features typically must be precise. If dimensions of features are just a small amount more than corresponding critical dimensions, the features can overlay other features. Accordingly, it is advantageous to form features with precise dimensions that are true to a design.

As previously noted, lithography steps are typically used to form these features, and at the source of the lithography steps is the mask. If the mask is not able to precisely form a pattern in a photoresist, the subsequently formed feature may not meet its critical dimension requirement. Some causes for a mask not being able to precisely form a pattern may be that the pattern formed in the mask itself is not precise, such as caused by a slight, unintended etching of material holding the pattern in the mask during the cleaning of the mask while being formed. This slight etch may widen the pattern in the mask beyond a critical dimension. Further, various physical characteristics of the mask, such a reflectivity percentage, a refractive index, and a coefficient of extinction, may cause an exposure through the mask to be improperly focused or allow spurious light to be incident on the photoresist.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a method for forming a mask and/or reticle for use in a lithography process, such as in semiconductor processing. Embodiments contemplate forming a binary mask for use in the lithography process, particularly at technology nodes of 20 nanometer (nm) and 28 nm. Other embodiments may also be applied to other lithography processes, other types of masks, for example a phase shift mask, and any technology node.

Figure 1:
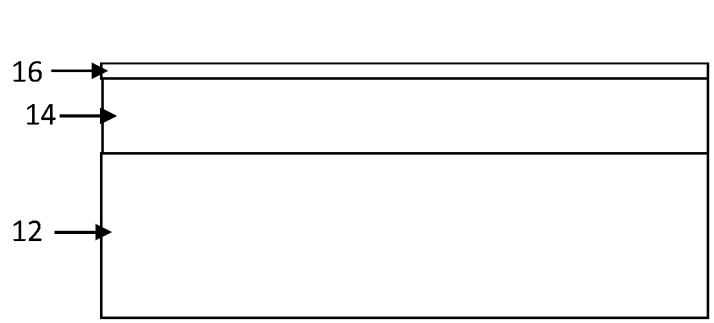
FIG. 1 illustrates a first layered structure used in forming a mask according to an embodiment.

FIG. 1 illustrates a first layered structure 10 used in forming a mask according to an embodiment. The layered structure 10 includes a substrate 12, a molybdenum silicon nitride ($Mo_xSi_yN_z$) layer 14, and a hardmask 16. The substrate 12 is an acceptable transparent material, such as quartz, low thermal expansive (LTE) glass, or the like. In an embodiment, the $Mo_xSi_yN_z$ layer 14 is a low reflectivity layer having, for example, an atomic weight percentage of molybdenum (x) between approximately 1 and 2 percent, an atomic weight percentage of silicon (y) between approximately 50 and 55 percent, and an atomic weight percentage of nitrogen (z) between approximately 40 and 50 percent. In another embodiment, the $Mo_xSi_yN_z$ layer 14 is a shielding layer having, for example, an atomic weight percentage of molybdenum (x) between approximately 4 and 5 percent, an atomic weight percentage of silicon (y) between approximately 45 and 50 percent, and an atomic weight percentage of nitrogen (z) between approximately 40 and 50 percent. The hardmask 16 is an acceptable material, such as a metal like chromium, tantalum, an oxide or nitride of a metal like chromium oxide, tantalum nitride, tantalum oxide, the like, or a combination thereof.

The $Mo_xSi_yN_z$ layer 14 is formed on a surface of the substrate 12 by, for example, a sputter deposition. In other embodiments, other physical vapor deposition (PVD) processes or the like may be used. A person having ordinary skill in the art will readily understand the appropriate parameters, gases, etc. used in forming the $Mo_xSi_yN_z$ layer 14 with a desired concentration or percentage of particular elements. The $Mo_xSi_yN_z$ layer 14 can be formed with any thickness, and in some embodiments, the thickness is between 40 nm and 75 nm. The hardmask 16 can be formed on a surface of the $Mo_xSi_yN_z$ layer 14 opposite the surface of the substrate 12 by PVD, atomic layer deposition (ALD), the like, or a combination thereof, with a thickness of, for example, 5 nm to 20 nm.

Figure 2:
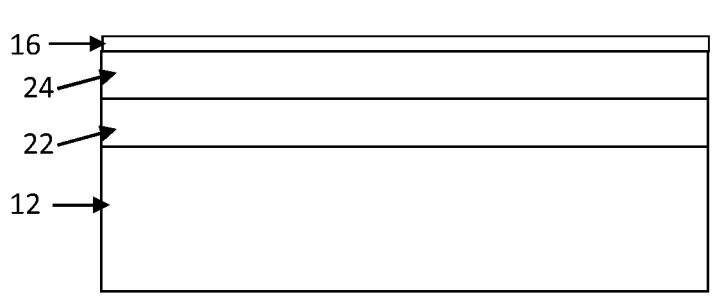
FIG. 2 illustrates a second layered structure used in forming a mask according to an embodiment.

FIG. 2 is a second layered structure 20 used in forming a mask according to an embodiment. A shielding layer 22, such as $Mo_{0.04-0.05}Si_{0.45-0.50}N_{0.40-0.50}$, is formed over the surface of the substrate 12, and a low reflectivity layer 24, such as $Mo_{0.01-0.02}Si_{0.50-0.55}N_{0.40-0.50}$, is formed over a surface of the shielding layer 22. The hardmask 16 is formed over a surface of the low reflectivity layer 24. The shielding layer 22 can have a thickness, for example, between 35 nm and 55 nm, and the low reflectivity layer 24 can have a thickness, for example, between 5 nm and 20 nm. When layers formed of the same elements but different compositions are used, the layers may be formed in situ by varying parameters of the deposition process used.

Figure 3:
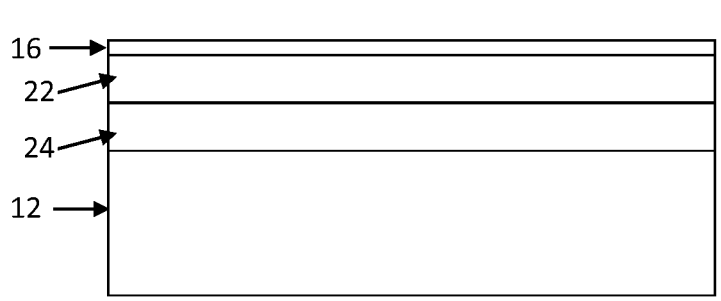
FIG. 3 illustrates a third layered structure used in forming a mask according to an embodiment.

FIG. 3 is a third layered structure 28 used in forming a mask according to an embodiment. The third layered structure 28 is similar to the second layered structure 20 of FIG. 2 except the positions of the shielding layer 22 and the low reflectivity layer 24 are switched.

Figure 4:
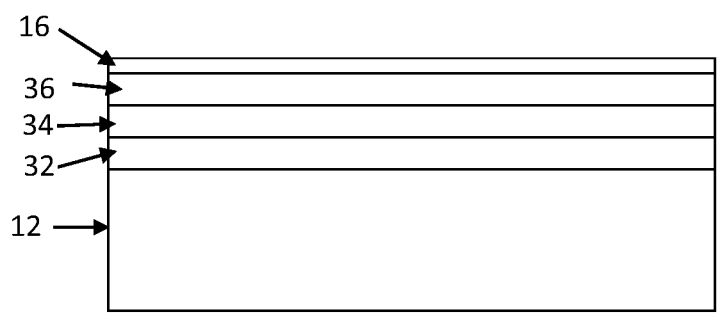
FIG. 4 illustrates a fourth layered structure used in forming a mask according to an embodiment.

FIG. 4 is a fourth layered structure 30 used in forming a mask according to an embodiment. A first low reflectivity layer 32 is over the substrate 12, and a shielding layer 34 is over the first low reflectivity layer 32. A second low reflectivity layer 36 is over the shielding layer 34, and the hardmask 16 is over the second low reflectivity layer 36. Each of the first low reflectivity layer 32 and the second low reflectivity layer 36 is, in this embodiment, $Mo_{0.01-0.02}Si_{0.50-0.55}N_{0.40-0.50}$, and each may have a thickness between approximately 5 nm and 20 nm. The shielding layer 34 is, in this embodiment, $Mo_{0.04-0.05}Si_{0.45-0.50}N_{0.40-0.50}$ and may have a thickness between approximately 30 nm and 55 nm.

Other embodiments contemplate various combinations and numbers of a low reflectivity layer(s) and/or shielding layer(s) comprising $Mo_xSi_yN_z$. A person having ordinary skill in the art will readily understand these modifications.

FIGS. 5 through 11 illustrate a method for forming a binary mask according to an embodiment. It should be noted that the order of steps discussed herein is as an example, and the steps may be performed in any logical order.

Figure 5:
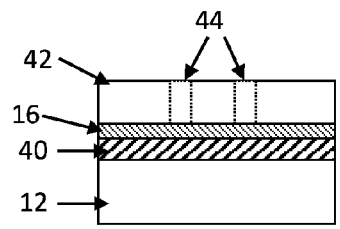
FIGS. 5 through 11 illustrate a method for forming a binary mask according to an embodiment.

In FIG. 5, a layered structure, such as any of layered structures 10, 20, 28, and 30, has a photoresist 42, such as a chemically amplified resist (CAR), formed thereon, such as by coating. Layer(s) 40 represents, for example, the $Mo_xSi_yN_z$ layer 14 in the layered structure 10; shielding layer 22 and the low reflectivity layer 24 in the layered structures 20 and 28; or the first low reflectivity layer 32, the shielding layer 34, and the second low reflectivity layer 36 in the layered structure 30. In FIG. 5, the photoresist 42 is exposed, such as by an electronic (e-beam) exposure, with a pattern 44.

Figure 9:
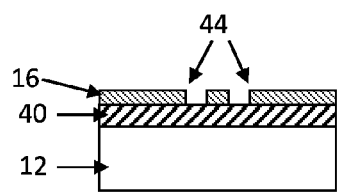
Figure 6:
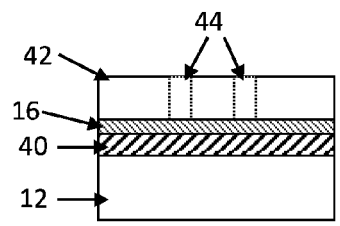
Figure 10:
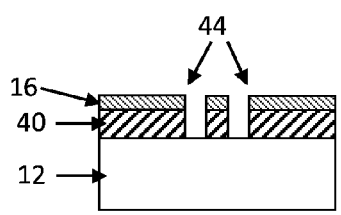
Figure 7:
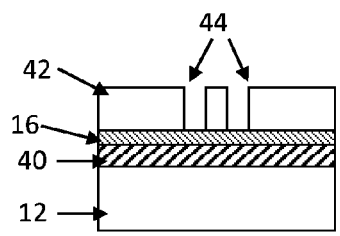
Figure 11:
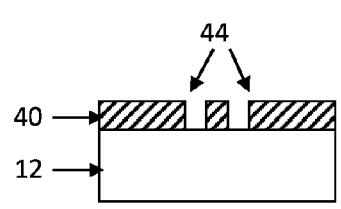
Figure 8:
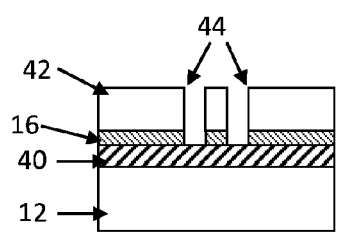

In FIG. 6, the structure is baked, such as at a temperature between approximately 90° C. and 130° C. In FIG. 7, the photoresist 42 is developed to form openings according to the pattern 44 through the photoresist 42 using, for example, a mixture of tetramethylammonium hydroxide (TMAH) and water. In FIG. 8, the hardmask 16 is etched to form openings through the hardmask 16 in the form of the pattern 44. The etching may be by a plasma etch using chlorine ($Cl_2$) and oxygen ($O_2$), although other acceptable etching techniques may be used. In FIG. 9, the photoresist 42 is removed, such as by using an acceptable strip process. In FIG. 10, layer(s) 40 is etched, such as using a plasma with sulfur hexafluoride ($SF_6$) and $O_2$, to form openings through the layer(s) 40 in the form of the pattern 44, thereby transferring the pattern 44 into the layer(s) 40. It should be noted that layer(s) 40 may have layers of different compositions of $Mo_xSi_yN_z$, and all of the present layers can be etched in a single etch step based on the same elements being in the layers although the respective compositions may be different. In such embodiments, no extra by-product is generally produced by the etching due to the presence of two or more layers. In FIG. 11, the hardmask 16 is removed using an acceptable strip process. It should be noted that after various etching and/or removing steps, components may be cleaned, such as with a sulfuric-peroxide mixture (SPM) or jet-spray with deionized water.

A correlation exists between the percentages of silicon and molybdenum in a $Mo_xSi_yN_z$ layer and the reflectivity of the layer. The percentage of reflectivity can be expressed by $R = 0.058x + 0.0011y$. By adjusting the composition of molybdenum and silicon, e.g., x and y, respectively, the percentage of reflectivity of the layer can be tuned. The following Table 1 summarizes various characteristics of $Mo_xSi_yN_z$ layers as discussed herein in various embodiments when a light having a wavelength at 193 nanometers is used in conjunction with a mask with the $Mo_xSi_yN_z$ layer, for example, during semiconductor processing.

TABLE 1

| Film | Mo (%) | Si (%) | N (%) | Refractive Index (n) | Extinction Coefficient (k) | Reflectivity (%) |
|---|---|---|---|---|---|---|
| Shielding layer | 4-5 | 45-50 | 40-50 | 2.2-2.4 | 0.55-0.60 | 34 |
| Low reflectivity layer | 1-2 | 50-55 | 40-50 | 2.5-2.6 | 0.60-0.65 | 12 |

Embodiments may achieve advantages. First, embodiments may have a reduced stress during processing because the various layers may have more similar coefficients of thermal expansion (CTE). Embodiments may also have better cleaning durability than conventional masks. For example, embodiments may have a critical dimension loss of approximately 0.1 nm per clean with a SPM clean or less than 0.1 nm per clean with a jet-spray clean with deionized water. These critical dimension losses are improvements of approximately 3 to 4 times over some conventional techniques. Further, as shown in Table 1, embodiments may vary the composition of a layer to adjust and tune the reflectivity, the refractive index (n), and the extinction coefficient (k) of the layer.

A first embodiment is a lithography mask comprising a transparent substrate and a first molybdenum silicon nitride ($Mo_xSi_yN_z$) layer. The first $Mo_xSi_yN_z$ layer is over the transparent substrate. A percentage of molybdenum (x) of the first $Mo_xSi_yN_z$ layer is between 1 and 2. A percentage of silicon (y) of the first $Mo_xSi_yN_z$ layer is between 50 and 55. A percentage of nitride (z) of the first $Mo_xSi_yN_z$ layer is between 40 and 50. The first $Mo_xSi_yN_z$ layer has an opening therethrough.

Another embodiment is a lithography mask comprising a substrate and a molybdenum-containing layer over a surface of the substrate. The molybdenum-containing layer comprises a first portion with a first percentage of molybdenum and a second portion with a second percentage of molybdenum. The first percentage and the second percentage are different.

Another embodiment is a lithography mask comprising a substrate and a molybdenum silicon nitride (MoSiN) structure on a surface of the substrate. The MoSiN structure comprises a first $Mo_{0.01-0.02}Si_{0.50-0.55}N_{0.40-0.50}$ layer. The MoSiN structure has an opening exposing the surface of the substrate.

A further embodiment is a method for forming a lithography mask. The method comprises forming a molybdenum-containing layer over a transparent substrate and forming a first opening through the molybdenum-containing layer. The molybdenum-containing layer comprises a first portion with a first percentage of molybdenum and a second portion with a second percentage of molybdenum. The first percentage being different from the second percentage.

A yet further embodiment is a method for forming a lithography mask. The method comprises forming a first molybdenum silicon nitride ($Mo_xSi_yN_z$) layer over a transparent substrate and forming a first opening through the first $Mo_xSi_yN_z$ layer. A percentage of molybdenum (x) of the first $Mo_xSi_yN_z$ layer is between 1 and 2. A percentage of silicon (y) of the first $Mo_xSi_yN_z$ layer is between 50 and 55. A percentage of nitride (z) of the first $Mo_xSi_yN_z$ layer is between 40 and 50.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a lithography mask, the method comprising:
    forming a molybdenum-containing layer over a transparent substrate, the molybdenum-containing layer comprising a first portion having a first thickness with a first percentage of molybdenum substantially uniformly throughout the first thickness and a second portion having a second thickness with a second percentage of molybdenum substantially uniformly throughout the second thickness, the first percentage being different from the second percentage; and
    forming a first opening through the molybdenum-containing layer.

2. The method of claim 1, wherein the molybdenum-containing layer further comprises silicon and nitrogen, the first portion comprising:
    the first percentage of molybdenum being between 1 and 2,
    a first percentage of silicon being between 50 and 55, and
    a first percentage of nitrogen being between 40 and 50,
    the second portion comprising:
    the second percentage of molybdenum being between 4 and 5,
    a second percentage of silicon being between 45 and 50, and
    a second percentage of nitrogen being between 40 and 50, and
    the first portion being over the second portion.

3. The method of claim 1, wherein the molybdenum-containing layer further comprises silicon and nitrogen, the first portion comprising:
    the first percentage of molybdenum being between 4 and 5,
    a first percentage of silicon being between 45 and 50, and
    a first percentage of nitrogen being between 40 and 50,
    the second portion comprising:
    the second percentage of molybdenum being between 1 and 2,
    a second percentage of silicon being between 50 and 55, and
    a second percentage of nitrogen being between 40 and 50, and
    the first portion being over the second portion.

4. The method of claim 1, wherein the molybdenum-containing layer further comprises silicon and nitrogen, the molybdenum-containing layer further comprising a third portion, the first portion comprising:
    the first percentage of molybdenum being between 1 and 2,
    a first percentage of silicon being between 50 and 55, and
    a first percentage of nitrogen being between 40 and 50,
    the second portion comprising:
    the second percentage of molybdenum being between 4 and 5,
    a second percentage of silicon being between 45 and 50, and
    a second percentage of nitrogen being between 40 and 50,
    the third portion comprising:
    a third percentage of molybdenum being between 1 and 2,
    a third percentage of silicon being between 50 and 55, and
    a third percentage of nitrogen being between 40 and 50, and
    the first portion being over the second portion, the second portion being over the third portion.

5. The method of claim 1, wherein the molybdenum-containing layer further comprises silicon and nitrogen.

6. The method of claim 1, wherein the transparent substrate comprises quartz.

7. The method of claim 1, wherein forming the first opening comprises using a hardmask on the molybdenum-containing layer to form the first opening.

8. A method comprising:
    forming a first $Mo_{x1}Si_{y1}N_{z1}$ layer having a first thickness over a transparent substrate, x1 being substantially uniform throughout the first thickness;
    forming a second $Mo_{x2}Si_{y2}N_{z2}$ layer having a second thickness over the first $Mo_{x1}Si_{y1}N_{z1}$ layer, x2 being substantially uniform throughout the second thickness, x1 being different from x2; and
    forming an opening through the first $Mo_{x1}Si_{y1}N_{z1}$ layer and the second $Mo_{x2}Si_{y2}N_{z2}$ layer to the transparent substrate.

9. The method of claim 8, wherein x1 is greater than x2.

10. The method of claim 8, wherein x1 is less than x2.

11. The method of claim 8, wherein x1 is in a range from 0.04 to 0.05, y1 is in a range from 0.45 to 0.50, z1 is in a range from 0.40 to 0.50, x2 is in a range from 0.01 to 0.02, y2 is in a range from 0.50 to 0.55, and z2 is in a range from 0.40 to 0.50.

12. The method of claim 8, wherein xi is in a range from 0.01 to 0.02, y1 is in a range from 0.50 to 0.55, z1 is in a range from 0.40 to 0.50, x2 is in a range from 0.04 to 0.05, y2 is in a range from 0.45 to 0.50, and z2 is in a range from 0.40 to 0.50.

13. The method of claim 8 further comprising forming a third $Mo_{x3}Si_{y3}N_{z3}$ layer over the second $Mo_{x2}Si_{y2}N_{z2}$ layer, x3 being substantially uniform throughout the third $Mo_{x3}Si_{y3}N_{z3}$ layer, x3 being different from x2, the opening being formed through the third $Mo_{x3}Si_{y3}N_{z3}$ layer.

14. The method of claim 8, wherein the transparent substrate comprises quartz.

15. A method comprising:
forming a binary mask comprising:
  forming a multi-layered structure over a transparent substrate, the multi-layered structure comprising:
    a first low reflectivity layer having a first thickness comprising molybdenum, a first concentration of molybdenum being substantially uniform throughout the first thickness, and
    a shielding layer having a second thickness comprising molybdenum, a second concentration of molybdenum being substantially uniform throughout the second thickness, the first concentration of molybdenum being less than the second concentration of molybdenum; and
  forming an opening through the multi-layered structure to the transparent substrate.

16. The method of claim 15, wherein the first low reflectivity layer is formed over the shielding layer.

17. The method of claim 15, wherein the shielding layer is formed over the first low reflectivity layer.

18. The method of claim 15, wherein the multi-layered structure further comprises a second low reflectivity layer comprising molybdenum, a third concentration of molybdenum being substantially uniform throughout a thickness of the second low reflectivity layer, the third concentration of molybdenum being less than the second concentration of molybdenum.

19. The method of claim 15, wherein the shielding layer has a refractive index (n) in a range from 2.2 to 2.4 and an extinction coefficient (k) in a range from 0.55 to 0.60 with respect to light having a wavelength of 193 nm, and the first low reflectivity layer has a refractive index (n) in a range from 2.5 to 2.6 and an extinction coefficient (k) in a range from 0.60 to 0.65 with respect to light having a wavelength of 193 nm.

20. The method of claim 15, wherein the transparent substrate comprises quartz.

* * * * *